United States Patent
Farrenkopf et al.

(10) Patent No.: US 7,379,283 B1
(45) Date of Patent: May 27, 2008

(54) ESD PROTECTION CIRCUIT WITH A LOW SNAPBACK VOLTAGE THAT IS PROTECTED FROM FAST NON-ESD VOLTAGE SPIKES AND RIPPLES

(75) Inventors: Douglas Robert Farrenkopf, Campbell, CA (US); Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/724,366

(22) Filed: Mar. 15, 2007

(51) Int. Cl.
*H02H 3/027* (2006.01)

(52) U.S. Cl. ............ 361/91.3; 361/56; 361/111

(58) Field of Classification Search ......... 361/56, 361/91.3, 111
See application file for complete search history.

(56) References Cited

U.S. PATENT DOCUMENTS

| | | | |
|---|---|---|---|
| 5,239,440 A | 8/1993 | Merrill | 361/91 |
| 5,835,328 A * | 11/1998 | Maloney et al. | 361/111 |
| 7,027,277 B1 | 4/2006 | Vashchenko et al. | 361/56 |
| 7,141,831 B1 | 11/2006 | Vashchenko et al. | 257/124 |
| 2004/0109270 A1* | 6/2004 | Stockinger et al. | 361/56 |
| 2005/0275984 A1* | 12/2005 | Liu et al. | 361/56 |

OTHER PUBLICATIONS

U.S. Appl. No. 11/724,622, filed Mar. 15, 2007, Vladislav Vashchenko et al.

* cited by examiner

*Primary Examiner*—Michael Sherry
*Assistant Examiner*—Tien Mai
(74) *Attorney, Agent, or Firm*—Mark C. Pickering

(57) ABSTRACT

A three-terminal snapback device is utilized with a control circuit to provide a low snapback voltage that is protected from non-ESD voltage spikes and ripples. In response to a fast edge, the control circuit lowers the snapback voltage, unless a status signal indicates that normal operating voltages are present, and raises the snapback voltage a predefined time later. If the fast edge represents an ESD pulse, SCR operation is initiated at the lowered snapback voltage. If the fast edge represents a power on sequence, the maximum voltage is less than the momentarily lowered snapback voltage and therefore insufficient to initiate SCR operation. Further, once normal operating voltages are present, the control circuit continuously maintains the raised snapback voltage so that a non-ESD voltage spike or ripple can not improperly turn on the snapback device.

18 Claims, 2 Drawing Sheets

ESD PROTECTION CIRCUIT WITH A LOW SNAPBACK VOLTAGE THAT IS PROTECTED FROM FAST NON-ESD VOLTAGE SPIKES AND RIPPLES

BACKGROUND OF THE INVENTION

1. Field of the Invention

The present invention relates to an electro-static discharge (ESD) protection circuit and, more particularly, to an ESD protection circuit with a low snapback voltage that is protected from non-ESD voltage spikes and ripples.

2. Description of the Related Art

A silicon-controlled rectifier (SCR) is a device that provides an open circuit between a first node and a second node when the voltage across the first and second nodes is positive and less than a snapback voltage. When the voltage across the first and second nodes rises to be equal to or greater than the snapback voltage, the SCR provides a low-resistance current path between the first and second nodes. Further, once the low-resistance current path has been provided, the SCR maintains the current path as long as the voltage across the first and second nodes is equal to or greater than a holding voltage that is lower than the snapback voltage.

As a result of these characteristics, SCRs have been used to provide electro-static discharge (ESD) protection. When used as an ESD protection circuit, the first node becomes a to-be-protected node, and the second node becomes a reference node. The SCR operates within an ESD protection window that has a maximum voltage defined by the destructive breakdown level of the to-be-protected node, and a minimum voltage (also known as a latch-up voltage) defined by any dc bias on the to-be-protected node. The snapback voltage of the SCR is then set to a value that is less than the maximum voltage of the window.

Thus, when the voltage across the to-be-protected node and the reference node is less than the snapback voltage, the SCR provides an open circuit between the to-be-protected node and the reference node. However, when the to-be-protected node receives a voltage spike that equals or exceeds the snapback voltage, such as when an ungrounded human-body contact occurs, the SCR provides a low-resistance current path from the to-be-protected node to the reference node. In addition, once the ESD event has passed and the voltage on the to-be-protected node falls below the holding voltage, the SCR again provides an open circuit between the to-be-protected node and the reference node.

FIG. 1 shows a cross-sectional view that illustrates a prior-art SCR 100. As shown in FIG. 1, SCR 100 includes a p−semiconductor substrate 110, an n+ buried layer 112 that is formed in the top surface of p− semiconductor substrate 110, and an n− epitaxial layer 114 that is grown on p− semiconductor substrate 110.

SCR 100 also includes an n− well 120, a p− well 122, and a number of shallow trench isolation regions 124 that are formed in n− epitaxial layer 114. In addition, SCR 100 includes an n+ region 130 and an p+ region 132 that are formed in n− well 120, separated by a shallow trench isolation region 124, and electrically connected together and to a to-be-protected node 134. As shown in FIG. 1, p+ region 132 lies closer to p− well 122 than does n+ region 130.

In addition, SCR 100 includes an n+ region 140 and a p+ region 142 that are formed in p− well 122, separated by a shallow trench isolation region 124, and electrically connected together and to a reference node 144. As shown in FIG. 1, n+ region 140 lies closer to n− well 120 than does p+ region 142.

In operation, when the voltage across nodes 134 and 144 is positive and less than the snapback voltage, the voltage reverse biases the junction between n-well 120 and p-well 122. The reverse-biased junction, in turn, blocks charge carriers from flowing from node 134 to node 144. However, when the voltage across nodes 134 and 144 is positive and equal to or greater than the snapback voltage, the reverse-biased junction breaks down due to avalanche multiplication.

The breakdown of the junction causes a large number of holes to be injected into p− well 122, and a large number of electrons to be injected into n− well 120. The increased number of holes increases the potential of p− well 122 in the region that lies adjacent to n+ region 140, and eventually forward biases the junction between p− well 122 and n+ region 140.

When the increased potential forward biases the junction, a npn transistor that utilizes n+ region 140 as the emitter, p− well 122 as the base, and n− well 120 as the collector turns on. When turned on, n+ (emitter) region 140 injects electrons into (base) p− well 122. Most of the injected electrons diffuse through (base) p− well 122 and are swept from (base) p− well 122 into (collector) n-well 120 by the electric field that extends across the junction. The electrons in (collector) n− well 120 are then collected by n+ region 130.

A small number of the electrons injected into (base) p− well 122 recombine with holes in (base) p− well 122 and are lost. The holes lost to recombination with the injected electrons are replaced by holes injected into (base) p− well 122 by the broken-down reverse-biased junction and, as described below, by the collector current of a pnp transistor, thereby providing the base current.

The electrons that are injected and swept into n− well 120 also decrease the potential of n− well 120 in the region that lies adjacent to p+ region 132, and eventually forward bias the junction between p+ region 132 and n− well 120. When the decreased potential forward biases the junction between p+ region 132 and n− well 120, a pnp transistor formed from p+ region 132, n− well 120, and p− well 122 turns on.

When turned on, p+ (emitter) region 132 injects holes into (base) n− well 120. Most of the injected holes diffuse through (base) n− well 120 and are swept from (base) n− well 120 into (collector) p− well 122 by the electric field that extends across the junction. The holes in (collector) p− well 122 are then collected by p+ region 142.

A small number of the holes injected into (base) n− well 120 recombine with electrons in (base) n− well 120 and are lost. The electrons lost to recombination with the injected holes are replaced by electrons flowing into n− well 120 as a result of the broken-down reverse-biased junction, and n− well 120 being the collector of the npn transistor. Thus, a small part of the npn collector current forms the base current of the pnp transistor.

Similarly, as noted above, the holes swept into (collector) p− well 122 also provide the base current holes necessary to compensate for the holes lost to recombination with the diffusing electrons injected by n+ (emitter) region 140. Thus, a small part of the pnp collector current forms the base current of the npn transistor.

Thus, n+ region 140 injects electrons that provide both the electrons for the collector current of the npn transistor as well as the electrons for the base current of the pnp transistor. At the same time, p+ region 132 injects holes that provide both the holes for the collector current of the pnp transistor as well as the holes for the base current of the npn transistor.

One of the advantages of SCR 100 over other ESD protection devices, such as a grounded-gate MOS transistor, is the double injection provided by n+ region 140 and p+ region 132 of SCR 100. With double injection, SCR 100 provides current densities (after snapback) that are about ten times greater than the densities provided by a grounded-gate MOS device, thus increasing the ESD protection capability. (Protection capability can be defined as the required contact width of the structure required to protect from a given ESD pulse amplitude, or the maximum protected ESD pulse amplitude for a given contact width.)

One of the disadvantages of SCR 100, however, is that a very large positive voltage, e.g., 50 volts, must be dropped across nodes 134 and 144 before the junction between n– well 120 and p– well 122 breaks down. As a result, SCR 100 can not be used to protect devices, such as MOS transistors, that can be permanently damaged by much lower voltages, e.g., 15 volts.

One solution to this problem, known as a laterally diffused MOS (LDMOS) SCR, incorporates a high-voltage LDMOS transistor into SCR 100. FIG. 2 shows a cross-sectional view that illustrates a prior art LDMOS SCR 200. LDMOS SCR 200 and SCR 100 are similar and, as a result, utilize the same reference numerals to designate the structures that are common to both devices.

As shown in FIG. 2, LDMOS SCR 200 differs from SCR 100 in that LDMOS SCR 200 includes a channel region 210 of p– well 122, a layer of gate oxide 212 that is formed on epitaxial layer 114, and a gate 214 that is formed on gate oxide layer 210 over channel region 210 and a portion of n– well 120. In addition, gate 214 is connected to reference node 144 via a resistor R.

In operation, LDMOS SCR 200 operates the same as SCR 100 except that gate 214 substantially lowers the snapback voltage. During an ESD event, the voltages on n+ region 130 and n– well 120 rise quickly with respect to the voltage (ground) on p+ region 142 and p– well 122. In addition, n– well 122 is capacitively coupled to gate 214. As a result, the voltage on gate 214 also rises quickly, and turns on the NMOS transistor operation of LDMOS SCR 200.

When the NMOS transistor operation of LDMOS SCR 200 turns on, electrons flow from n+ region 140 to n+ region 130. The rising voltage on n– well 120 along with the flow of electrons into n– well 120 causes the pn junction between n– well 120 and p– well 122 to break down at a much lower snapback voltage than the snapback voltage of SCR 100. Once the pn junction breaks down, LDMOS SCR 200 continues to operate the same as SCR 100.

One problem with LDMOS SCR 200 is that, because of the low snapback voltage, LDMOS SCR 200 is susceptible to improperly turning on in response to non-ESD voltage spikes and ripples. For example, when LDMOS SCR 200 is utilized to ESD protect an input voltage pin (e.g., node 134 is connected to the input voltage pin and node 144 is connected to a ground pin) of a high-voltage switcher, such as a high-voltage buck converter, the high-voltage signals output by the switcher can cause non-ESD voltage spikes and ripples to appear on the input voltage pin of the switcher, and thereby on node 134 of LDMOS SCR 200. Since LDMOS SCR 200 has a relatively low snapback voltage, the non-ESD voltage spikes and ripples on node 134 can cause LDMOS SCR 200 to improperly turn on.

Thus, there is a need for an ESD protection circuit with a low snapback voltage that is protected from non-ESD voltage spikes and ripples.

DETAILED DESCRIPTION OF THE INVENTION

Figure 1:
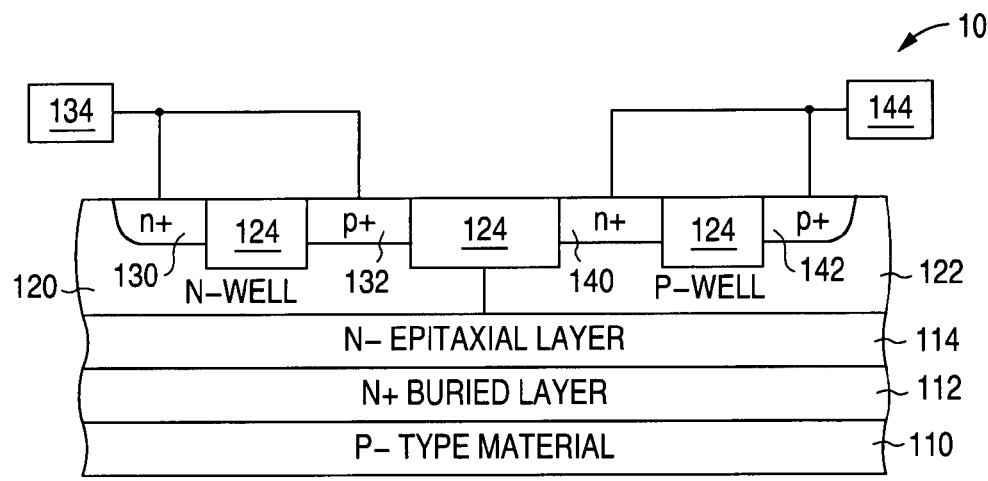
FIG. 1 is a cross-sectional view illustrating a prior-art SCR 100.
Figure 2:
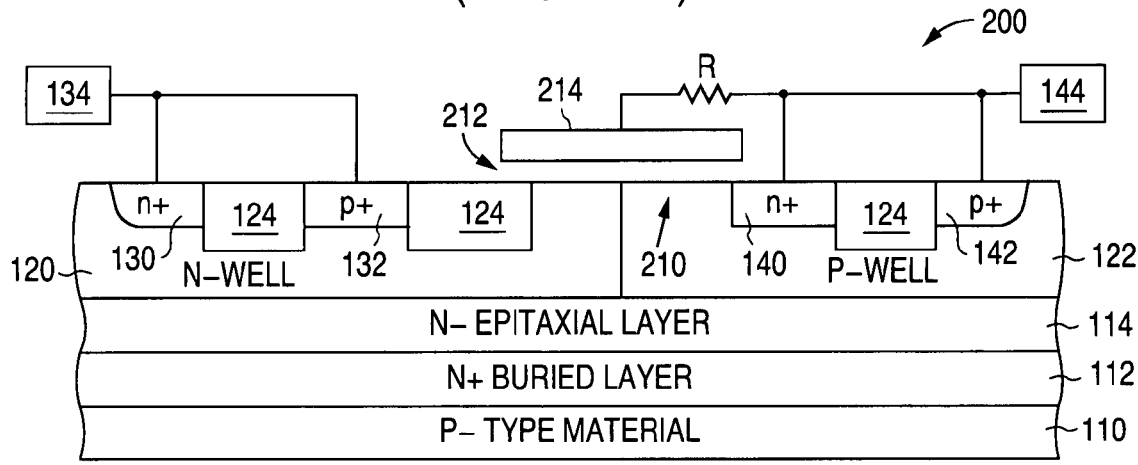
FIG. 2 is a cross-sectional view illustrating a prior art LDMOS SCR 200.
Figure 3:
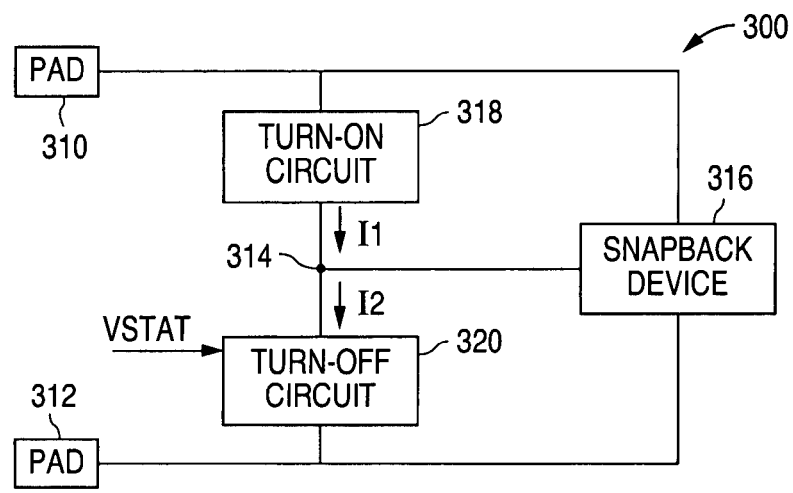
FIG. 3 is a block diagram illustrating an example of an electrostatic discharge (ESD) protection circuit 300 in accordance with the present invention.

FIG. 3 shows a block diagram that illustrates an example of an electrostatic discharge (ESD) protection circuit 300 in accordance with the present invention. As described in greater detail below, ESD protection circuit 300 utilizes a three-terminal snapback device along with a control circuit to provide a low snapback voltage that is protected from non-ESD voltage spikes and ripples.

As shown in FIG. 3, ESD protection circuit 300 includes a pad 310, a pad 312, a control node 314, and a snapback device 316 that is electrically connected to pad 310, pad 312, and control node 314. Snapback device 316 can be implemented with any three-terminal snapback device, such as a MOS-based snapback device like LDMOS SCR 200, which can change the magnitude of the snapback voltage in response to voltage changes on the third terminal (the gate 214 of LDMOS SCR 200).

When LDMOS SCR 200 is utilized to implement snapback device 316, pad 310 is connected to the to-be-protected node 134, pad 312 is connected to reference node 144, and control node 314 is connected to gate 214. Further, LDMOS SCR 200 provides both transistor operation and SCR operation where the transistor operation lowers and raises the magnitude of the snapback voltage. Other examples of LDMOS SCRs are described in U.S. Pat. Nos. 7,027,277 issued on Apr. 11, 2006 and 7,141,831 issued on Nov. 28, 2006, which are hereby incorporated by reference.

As further shown in FIG. 3, ESD protection circuit 300 also includes a turn-on circuit 318 that is electrically connected to pad 310, pad 312, and control node 314. In operation, when the voltage on pad 310 (measured with respect to the voltage on pad 312) quickly rises by more than a turn-on voltage, turn-on circuit 318 sources a current I1 into control node 314 to pull up the voltage on control node 314 to lower the magnitude of the snapback voltage of snapback device 316. In the case of LDMOS SCR 200, pulling up the voltage on control node 314 turns on the transistor operation of LDMOS SCR 200.

As further shown in FIG. 3, ESD protection circuit 300 includes a turn-off circuit 320 that is electrically connected to pad 310, pad 312, and control node 314. In operation, a predetermined time after turn-on circuit 318 sources current I1 into control node 314 to lower the magnitude of the snapback voltage, turn-off circuit 320 sinks a current I2 from control node 314 to pull down the voltage on control node 314 to raise the magnitude of the snapback voltage. In the case of LDMOS SCR 200, pulling down the voltage on control node 314 turns off the transistor operation of LDMOS SCR 200.

Turning on the transistor operation of LDMOS SCR 200 lowers the snapback voltage, while turning off the transistor operation raises the snapback voltage. Turn-off circuit 320 can sink substantially more current from control node 314 than turn-on circuit 318 can source. As a result, turn-off circuit 320 pulls down the voltage on control node 314 even if turn-on circuit 318 continues to source current I1 into control node 314.

Thus, in response to a fast edge on pad 310, turn-on circuit 318 sources current I1 into control node 314 to lower the snapback voltage of snapback device 316 (turn on the transistor operation of LDMOS SCR 200). If the fast edge results from a normal power on sequence, the maximum voltage on pad 310 never exceeds the lowered snapback voltage. As a result, the SCR operation of snapback device 316 never turns on.

After the predetermined period of time, turn-off circuit 320 sinks current I2 from control node 314 to raise the snapback voltage of snapback device 316 (turn off the transistor operation of snapback device 316). Thus, a normal power on sequence causes snapback device 316 to momentarily lower the snapback voltage of snapback device 316 (momentarily turn on the transistor operation of LDMOS SCR 200).

As noted above, in response to a fast edge on pad 310, turn-on circuit 318 sources current I1 into control node 314 to pull up the voltage on control node 314 to lower the snapback voltage of snapback device 316 (turn on the transistor operation of LDMOS SCR 200). If the fast edge results from an ESD event, then snapback device 316 breaks down at the lowered snapback voltage to turn on the SCR operation of snapback device 316.

As is well known, once a snapback device snaps back, the snapback device remains turned on until the input voltage falls below the holding voltage. As a result, once the SCR operation turns on, pulling the voltage on gate 214 of LDMOS SCR 200 down to ground while the voltage on n+ region 130 remains above the holding voltage does not turn off the SCR operation of LDMOS SCR 200, but instead ensures that LDMOS SCR 200 remains turned off once the voltage on n+ region 130 falls below the holding voltage. (As noted above, pulling the voltage on gate 214 down to ground during normal operation turns off the transistor operation of LDMOS SCR 200.)

In accordance with the present invention, turn-off circuit 320 also receives a status signal VSTAT that indicates that the circuits are normally powered on. For example, the status signal VSTAT can be provided by a pin of a high-voltage switcher when the pin carries an internally generated voltage, such as VDD.

In response to the status signal VSTAT, turn-off circuit 320 continuously pulls down the voltage on control node 314 to continuously maintain a raised snapback voltage (to keep the transistor operation of LDMOS SCR 200 turned off). Thus, when non-ESD voltage spikes and ripples are present on pad 310, the non-ESD voltage spikes and ripples must be greater than the raised snapback voltage before the SCR operation of snapback device 316 can improperly turn on. The non-ESD voltage spikes and ripples are typically not greater than the raised snapback voltage. As a result, ESD protection circuit 300 is typically immune to non-ESD voltage spikes and ripples on pad 310.

Thus, turn-on circuit 318 lowers the magnitude of the snapback voltage when the voltage on pad 310 rises by more than a turn-on voltage unless the status signal VSTAT indicates that normal operating voltages are present. Further, turn-off circuit 320 raises the magnitude of the snapback voltage a predetermined time after turn-on circuit 318 lowers the magnitude of the snapback voltage. Therefore, the present invention provides an ESD protection circuit with a low snapback voltage that is protected from non-ESD voltage spikes and ripples.

Figure 4:
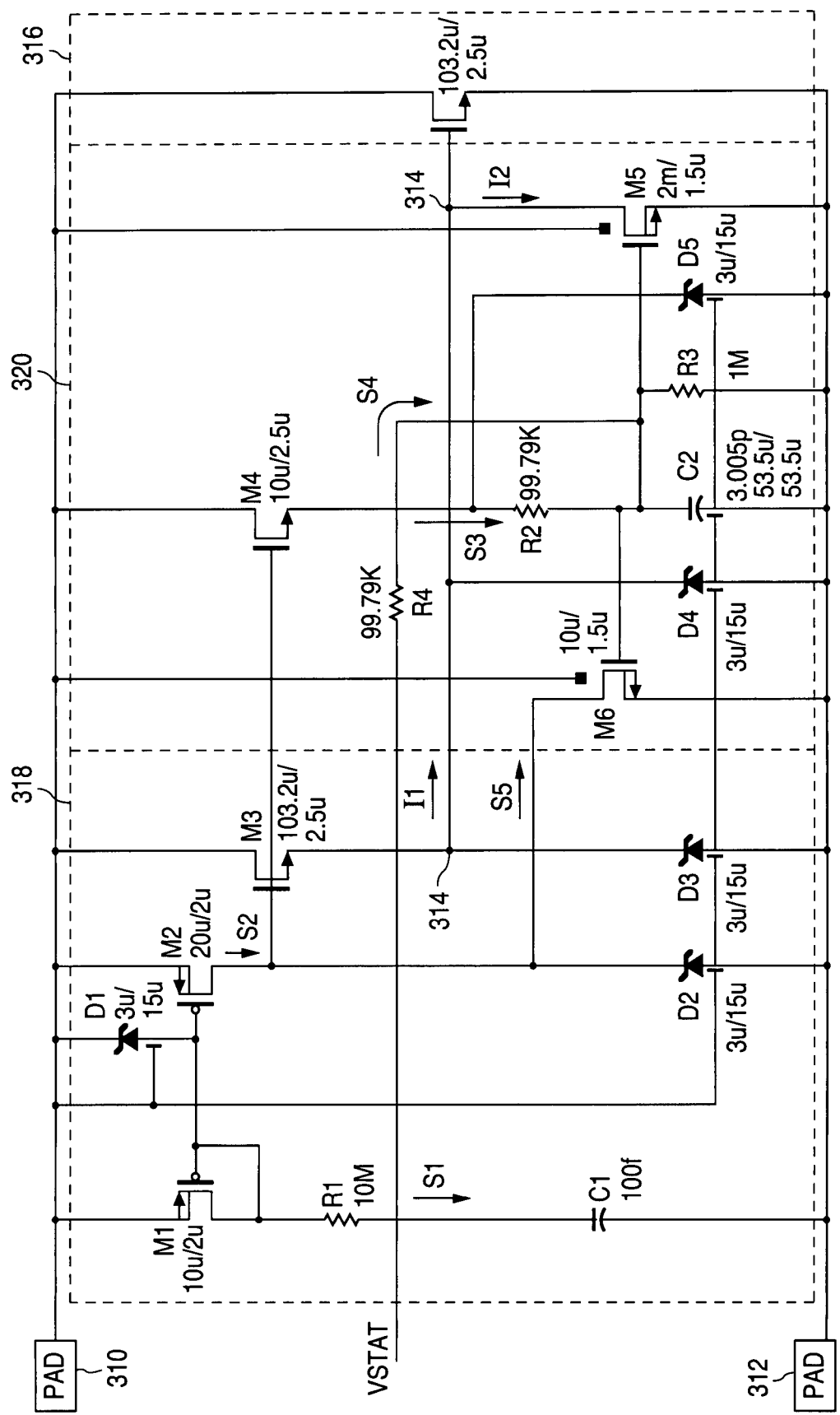
FIG. 4 is a circuit diagram illustrating an example of an implementation of ESD protection circuit 300 in accordance with the present invention.

FIG. 4 shows a circuit diagram that illustrates an example of an implementation of ESD protection circuit 300 in accordance with the present invention. As shown in the FIG. 4 example, snapback device 316 is formed as a LDMOS SCR, which is schematically represented as an NMOS transistor that has a drain connected to pad 310, a source connected to pad 312, and a gate connected to control node 314.

As further shown in FIG. 4, turn-on circuit 318 includes a PMOS transistor M1, a resistor R1, and a capacitor C1. PMOS transistor M1 has a gate, a source connected to pad 310, and a drain connected to a first end of resistor R1. Capacitor C1 has a first plate connected to a second end of resistor R1, and a second plate connected to pad 312. (Capacitor C1 can be implemented as a high-voltage parasitic metal1/poly or metal1/metal2 capacitor.)

Turn-on circuit 318 also includes a PMOS transistor M2, a diode D1, and a diode D2. PMOS transistor M2 has a drain, a gate connected to the gate of transistor M1, and a source connected to pad 310. Diode D1 has an input connected to the gates of transistors M1 and M2, and an output connected to pad 310. Diode D2 has an input connected to pad 312, and an output connected to the drain of transistor M2.

Further, turn-on circuit 318 includes an NMOS transistor M3. NMOS transistor M3 has a source, a drain connected to pad 310, and a gate connected to the drain of transistor M2. When circuit 300 is utilized in a high-voltage application, such as to protect an input voltage pin of a high-voltage switcher, NMOS transistor M3 is implemented as an DMOS transistor because of the large drain-to-source voltages that are present during normal operation.

In addition, turn-on circuit 318 also includes a diode D3. Diode D3 has an input that is connected to pad 312, and an output that is connected to the source of NMOS transistor M3. Further, in the present example, diodes D1-D3 are formed in an epitaxial layer that is electrically connected to pad 310.

In operation, when the voltage on pad 310 rises by more than the turn-on voltage of PMOS transistor M1, which is connected as a diode, a current S1 flows through transistor M1 and resistor R1 to charge up capacitor C1. Transistor M2 mirrors current S1 and outputs a current S2. Current S2 pulls up the voltage on the gate of NMOS transistor M3 to turn on transistor M3. When NMOS transistor M3 turns on, transistor M3 sources a current I1 into control node 314 to pull up the voltage on control node 314 to turn on the transistor operation of snapback device 316.

In addition, diode D1 functions to ensure that the voltage on the gates of transistors M1 and M2 does not exceed the voltage on pad 310 by more than a diode breakdown voltage. Diode D2 limits the maximum voltage on the gate of transistor M3, while diode D3 limits the maximum voltage on control node 314.

With respect to turn-off circuit 320, turn-off circuit 320 includes an NMOS transistor M4 which has a source, a drain connected to pad 310, and a gate connected to the drain of transistor M2. As with NMOS transistor M3, NMOS transistor M4 is implemented as an DMOS transistor when circuit 300 is utilized in a high-voltage application because of the large drain-to-source voltages that are present during normal operation.

Turn-off circuit 320 also includes an NMOS transistor M5 and an NMOS transistor M6. NMOS transistor M5 has a gate, a source connected to pad 312, and a drain connected to control node 314. NMOS transistor M6 has a gate connected to the gate of transistor M5, a source connected to pad 312, and a drain connected to the drain of transistor M2.

Further, turn-off circuit 320 also includes a resistor R2, a resistor R3, and a capacitor C2. Resistor R2 has a first end connected to the source of transistor M4, and a second end connected to the gates of transistors M5 and M6. Resistor R3 has a first end connected to the gates of transistors M5 and M6, and a second end connected to pad 312. Capacitor C2 has a first plate connected to the gates of transistors M5 and M6, and a second plate connected to pad 312.

In addition, turn-off circuit 320 also includes a diode D4, a resistor R4, and a diode D5. Diode D4 has an input connected to pad 312, and an output connected to control node 314. Resistor R4 has a first end connected to receive a status signal VSTAT, and a second end connected to the gates of transistors M5 and M6. Diode D5 has an output connected to the source of transistor M4, and an input connected to pad 312. In the present example, transistors M5 and M6, capacitor C2, and diodes D4 and D5 are formed in an epitaxial layer that is electrically connected to pad 310.

In operation, when NMOS transistor M3 turns on, NMOS transistor M4 also turns on and sources a current S3. Current S3 flows through resistors R2 and R3 to charge up the voltage on capacitor C2. As the voltage on capacitor C2 rises, the voltage turns on NMOS transistors M5 and M6.

When NMOS transistor M5 turns on, transistor M5 sinks a current I2 from control node 314. Current I2 pulls down the voltage on control node 314 to turn off the transistor operation of snapback device 316. Thus, by properly sizing resistors R2 and R3 and capacitor C2, the transistor operation of snapback device 316 can be caused to turn on for a period of time in response to a fast edge, thereby lowering the snapback voltage for the period of time. If the fast edge represents an ESD event, SCR operation is initiated at the lowered snapback voltage. If the fast edge represents a normal power on sequence, the transistor operation of snapback device 316 is only turned on momentarily.

In addition, in accordance with the present invention, the status signal VSTAT, which can be output as a voltage during the normal operation of a chip, such as a high-voltage switching circuit, causes a current S4 to flow through resistors R4 and R3 during normal operation. The voltage drop across resistor R3 causes the voltage on the gates of transistors M5 and M6 to be continuously maintained high which, in turn, causes transistor M5 to continuously pull down the voltage on control node 314.

Thus, during normal operation, snapback device 316 has the raised snapback voltage. As a result, if the fast edge represents a non-ESD voltage spike during normal operation, snapback device 316 is prevented from turning on improperly because the non-ESD voltage spike is less than the raised snapback voltage.

Further, as noted above, as the voltage on capacitor C2 rises, the voltage turns on NMOS transistors M5 and M6. When NMOS transistor M6 turns on, transistor M6 sinks a current S5 from the drain of transistor M2. Current S5 pulls down the voltage on the gate of NMOS transistor M3, thereby turning off transistor M3 even if PMOS transistor M2 continues to source current I2.

Thus, ESD protection circuit 300 is operated by lowering the magnitude of the snapback voltage of snapback device 316 when the voltage on pad 310 rises by more than the turn-on voltage unless the status signal VSTAT indicates that normal operating voltages are present. Further, the magnitude of the snapback voltage is raised a predetermined time after the magnitude of the snapback voltage was lowered. As discussed, the magnitude of the snapback voltage is lowered by sourcing current I1 into control node 314, and raised by sinking current I2 from control node 314.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. An electrostatic discharge (ESD) protection circuit comprising:
 a snapback device connected to a control node, the snapback device having a snapback voltage;
 a first transistor connected to the control node, the first transistor having a gate, the first transistor to source a pull-up current to the control node when the first transistor turns on, a net inflow of current into the control node to raise a voltage on the control node to lower the snapback voltage;
 a second transistor having a gate connected to the gate of the first transistor, the second transistor to source a time-out current when the second transistor turns on;
 a timing control circuit connected to the second transistor, the timing control circuit to sink the time-out current, and generate a timing voltage in response to the time-out current; and
 a third transistor connected to the timing control circuit and the control node, the third transistor to receive the timing voltage, and sink a pull-down current from the control node when the third transistor turns on, a net outflow of current from the control node to lower a voltage on the control node to raise the snapback voltage.

2. The ESD protection circuit of claim 1 and further comprising a status current that flows into the timing control circuit when normal operating voltages are present, the third transistor to turn on in response to the status current flowing into the timing control circuit.

3. The ESD protection circuit of claim 1 and further comprising a current mirror connected to the gates of the first and second transistors.

4. The ESD protection circuit of claim 3 and further comprising a time sense circuit connected to the current mirror.

5. The ESD protection circuit of claim 4 wherein the time sense circuit is unconnected to the gates of the first and second transistors.

6. The ESD protection circuit of claim 4 wherein the current mirror is connected to the snapback device, and the time sense circuit is connected to the snapback device.

7. The ESD protection circuit of claim 4 wherein the time sense circuit includes a resistive element connected to a capacitor.

8. The ESD protection circuit of claim 4 and further comprising a fourth transistor connected to the timing control circuit, the current mirror, and the gates of the first and second transistors, the fourth transistor to pull down a voltage on the gates of the first and second transistors when the fourth transistor turns on.

9. The ESD protection circuit of claim 1 and further comprising a fourth transistor connected to the timing control circuit and the gates of the first and second transistors, the fourth transistor to pull down a voltage on the gates of the first and second transistors when the fourth transistor turns on.

10. The ESD protection circuit of claim 1 wherein the snapback device is connected to a first pad and a second pad.

11. The ESD protection circuit of claim 1 wherein the first and second transistors turn on in response to an ESD event, and the third transistor turns on a predetermined time after the first and second transistors turn on.

12. The ESD protection circuit of claim 1 wherein a size of the first transistor is smaller than a size of the third transistor.

13. The ESD protection circuit of claim 1 wherein the third transistor continuously pulls down the voltage on the control node when a status signal indicates that normal operating voltages are present.

14. An electrostatic discharge (ESD) protection circuit comprising:
   an ESD switch connected to a control node to receive a control voltage;
   a first transistor connected to the control node, the first transistor having a gate, the first transistor to source a pull-up current to the control node when the first transistor turns on, a net inflow of current into the control node to raise the control voltage;
   a second transistor having a gate connected to the gate of the first transistor, the second transistor to source a time-out current when the second transistor turns on;
   a timing control circuit connected to the second transistor, the timing control circuit to sink the time-out current, and generate a timing voltage in response to the time-out current; and
   a third transistor connected to the timing control circuit and the control node, the third transistor to receive the timing voltage, and sink a pull-down current from the control node when the third transistor turns on, a net outflow of current from the control node to lower the control voltage on the control node.

15. The ESD protection circuit of claim 14 and further comprising a fourth transistor connected to the timing control circuit and the gates of the first and second transistors, the fourth transistor to pull down a voltage on the gates of the first and second transistors when the fourth transistor turns on.

16. The ESD protection circuit of claim 14 and further comprising a status current that flows into the timing control circuit when normal operating voltages are present, the third transistor to turn on in response to the status current flowing into the timing control circuit.

17. The ESD protection circuit of claim 14 wherein the ESD switch is a snapback device that only turns on when a voltage difference exceeds a threshold voltage, and stays on after exceeding the threshold voltage as long as the voltage difference remains greater than a holding voltage.

18. The ESD protection circuit of claim 14 and further comprising a current mirror connected to the gates of the first and second transistors.

* * * * *